(12) United States Patent
Enomoto et al.

(10) Patent No.: US 8,591,612 B2
(45) Date of Patent: Nov. 26, 2013

(54) CERIUM OXIDE SLURRY, CERIUM OXIDE POLISHING SLURRY AND METHOD FOR POLISHING SUBSTRATE USING THE SAME

(71) Applicant: Hitachi Chemical Co., Ltd., Tokyo (JP)

(72) Inventors: Kazuhiro Enomoto, Hitachi (JP); Shigeru Yoshikawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/741,954

(22) Filed: Jan. 15, 2013

(65) Prior Publication Data

US 2013/0125476 A1    May 23, 2013

Related U.S. Application Data

(62) Division of application No. 11/550,948, filed on Oct. 19, 2006, now abandoned.

(30) Foreign Application Priority Data

Oct. 19, 2005 (JP) ................................. 2005-304311

(51) Int. Cl.
C09G 1/02 (2006.01)

(52) U.S. Cl.
USPC ........................................... 51/307; 252/79.1

(58) Field of Classification Search
USPC .............. 51/298, 307, 309; 451/41; 252/79.1, 252/79.4
See application file for complete search history.

(56) References Cited

U.S. PATENT DOCUMENTS

| | | | |
|---|---|---|---|
| 6,221,118 B1 | 4/2001 | Yoshida et al. | |
| 6,410,444 B1 | 6/2002 | Kido et al. | |
| 6,569,350 B2 | 5/2003 | Kaufman et al. | |
| 6,783,434 B1 * | 8/2004 | Akahori et al. | 451/41 |
| 6,824,578 B2 | 11/2004 | Uchino et al. | |
| 6,827,752 B2 | 12/2004 | Nojo et al. | |
| 2002/0016060 A1 * | 2/2002 | Matsuzawa et al. | 438/633 |
| 2004/0010978 A1 | 1/2004 | Uchino et al. | |
| 2004/0221516 A1 | 11/2004 | Cho et al. | |
| 2005/0118820 A1 | 6/2005 | Akahori et al. | |
| 2006/0124591 A1 | 6/2006 | Haga et al. | |
| 2006/0148667 A1 | 7/2006 | Fukasawa et al. | |
| 2006/0246723 A1 | 11/2006 | Park et al. | |
| 2008/0214093 A1 | 9/2008 | Fukasawa et al. | |

FOREIGN PATENT DOCUMENTS

| | | |
|---|---|---|
| CN | 1235698 A | 11/1999 |
| CN | 1526786 A | 9/2004 |
| JP | 10-106994 A | 4/1998 |
| JP | 10-154673 A | 6/1998 |
| JP | 2000-017195 A | 1/2000 |
| JP | 2001-351882 A | 12/2001 |
| JP | 2002-353175 A | 12/2002 |
| JP | 2003-171653 A | 6/2003 |
| TW | 591100 B | 6/2004 |
| TW | 200425316 A | 11/2004 |
| WO | 02-31079 A1 | 4/2002 |
| WO | 2004/061925 A1 | 7/2004 |
| WO | 2004/068570 A1 | 8/2004 |

OTHER PUBLICATIONS

Korean Office Action dated Jan. 27, 2010, issued in corresponding Korean Patent Application No. 10-2008-7011737 (With English Translation).
Taiwanese Office Action dated Jul. 2, 2010, issued in corresponding Taiwanese Patent Application No. 095138334.
Taiwanese Office Action dated Feb. 8, 2011, issued in corresponding Taiwanese Patent Application No. 095138334.
Chinese Office Action dated Apr. 7, 2011, issued in corresponding Chinese Patent Applicatioin No. 2006800385775.
Taiwanese Office Action dated Jun. 7, 2011, issued in corresponding Taiwanese Patent Application No. 095138334.
Japanese Office Action dated Aug. 23, 2011, issued in corresponding Japanese Patent Application No. 2007-541007.
International Search Report dated Jan. 23, 2007 (mailing date), issued in corresponding International Application No. PCT/JP2006/320748.
Written Opinion (PCT/ISA/237) dated Jan. 23, 2007 (mailing date), issued in corresponding International Application No. PCT/JP2006/320748.
Written Opinion dated Apr. 21, 2009, for Singaporian Application No. SG200802884-7.
Search Report dated May 18, 2009, for Singaporian Application No. SG00802884-7.
Chinese Office Action dated Oct. 23, 2009 (issue date), issued in corresponding Chinese Patent Application No. 200680038775.
Written Opinion (PCT/ISA/237) dated Jul. 10, 2008, issued in corresponding International Application No. PCT/JP2006/320748.

* cited by examiner

Primary Examiner — Pegah Parvini
(74) Attorney, Agent, or Firm — Westerman, Hattori, Daniels & Adrian, LLP

(57) ABSTRACT

The present invention provides a cerium oxide slurry, a cerium oxide polishing slurry, and a method of polishing a substrate by using the same, wherein decrease of scratches and polish at high speed can be realized by reducing the content of coarse grains by improving in the disperse state of cerium oxide particles. The invention relates to a cerium oxide slurry containing cerium oxide particles, dispersant and water, in which the ratio of weight of cerium oxide/weight of dispersant is in a range of 20 to 80 and relates a cerium oxide polishing slurry comprising the cerium oxide slurry and additives such as a water-soluble polymer.

16 Claims, 2 Drawing Sheets

CERIUM OXIDE SLURRY, CERIUM OXIDE POLISHING SLURRY AND METHOD FOR POLISHING SUBSTRATE USING THE SAME

CROSS REFERENCE TO RELATED APPLICATION

This application is a divisional application of U.S. patent application Ser. No. 11/550,948 filed Oct. 19, 2006, now abandoned and is based upon and claims the benefits of the priority from Japanese Patent Application No. 2005-304311, which was filed on Oct. 19, 2005, the entire contents of which are incorporated herein by reference.

BACKGROUND OF THE INVENTION

1. Field of the Invention

The present invention relates to a cerium oxide slurry, a cerium oxide polishing slurry, and a method of polishing a substrate using the same.

2. Description of the Related Art

In recent manufacturing process of ULSI semiconductor devices, various processing technologies for higher density and finer size are researched and developed. One of them is CMP (chemical mechanical polishing) technology, which is now an indispensable technology in manufacturing process of semiconductor devices for flattening of interlayer dielectrics or BPSG films (silicon dioxide film doped with boron or phosphorus), isolation and forming of shallow trench devices, and forming of plugged and embedded metal wiring.

Conventionally, in manufacturing process of semiconductor devices, inorganic dielectrics layer such as silicon oxide insulation film are formed by plasma CVD or low-pressure CVD method. As chemical-mechanical polishing slurry for flattening the inorganic dielectrics layer, a fumed silica polishing slurry is generally used. The fumed silica polishing slurry is prepared, for example, by growing the grains by pyrolysis of silicon tetrachloride, and adjusting the pH.

However, such fumed silica polishing slurry is low in polishing speed.

In the generation after Design Rule 0.25 µm, shallow trench isolation is employed in isolation of devices in integrated circuits. In shallow trench isolation, CMP is used for removing excess silicon oxide films formed on the substrate. A stopper film of small polishing speed is formed beneath the silicon oxide film in order to stop polishing. The stopper film is made of silicon nitride or the like, and it is preferred that the polishing speed ratio between the silicon oxide film and stopper film may be greater.

However, the polishing slurry of colloid silica composition is small in the polishing speed ratio between the silicon oxide film and stopper film, being about 3, and so far from practical property for shallow trench isolation.

On the other hand, cerium oxide polishing slurry is used as polishing slurry for glass surface such as photo mask or lens. Cerium oxide particles are lower in hardness as compared with silica particles or alumina particles. Therefore, the polishing surface is hardly scratched, and this solution is useful for mirror smooth finishing. Moreover, the polishing speed is faster than silica polishing slurry.

When the cerium oxide polishing slurry for glass surface polishing is directly used in polishing of inorganic dielectrics, however, primary particle size of cerium oxide is too large, and the insulation film surface may be scratched. Recently, a cerium oxide polishing solution using cerium oxide abrasives adjusted uniformly in primary particle size is proposed (see, for example, Japanese Patent Application Laid-Open No. 10-106994).

Coarse grains of cerium oxide particles are also known to cause scratches, and a composition limited in coarse grain amount is proposed (see, for example, Japanese Patent Application Laid-Open No. 2003-171653).

SUMMARY OF THE INVENTION

It is hence an object of the invention to decrease scratches and polish at high speed by reducing the content ratio of coarse grains. For this purpose, the invention provides a cerium oxide slurry, a cerium oxide polishing slurry, and a method of polishing a substrate by using the same, improved in the disperse state of cerium oxide particles by controlling the weight of cerium oxide particles and the weight of dispersant to an optimum ratio.

The invention of (1) relates to a cerium oxide slurry containing cerium oxide particles, dispersant and water, in which the ratio of weight of cerium oxide/weight of dispersant is in a range of 20 to 80.

The invention of (2) relates to the cerium oxide slurry of (1), in which the dispersant is a compound of which solubility in water is 0.1 wt. % to 99.9 wt. %.

The invention of (3) relates to the cerium oxide slurry of (1) or (2), in which the dispersant is a salt of poly (meth)acrylic acid.

The invention of (4) relates to the cerium oxide slurry of any one of (1) to (3), in which the dispersant is ammonium salt polyacrylate or copolymer of polyacrylic acid-alkyl ammonium polyacrylate.

The invention of (5) relates to a cerium oxide polishing slurry comprising the cerium oxide slurry of any one of (1) to (4), and a water-soluble polymer.

The invention of (6) relates to the cerium oxide polishing slurry of (5), in which the cerium oxide polishing slurry is a one-pack storage type.

The invention of (7) relates to the cerium oxide polishing slurry of (5), in which the cerium oxide polishing slurry is a two-pack storage type consisting of cerium oxide slurry, and an additive solution including water-soluble polymer and water.

The invention of (8) relates to a polishing method of substrate comprising polishing a film to be polished by relatively moving a polishing table and a substrate having the film to be polished in the state that the substrate is pressed against a polishing cloth of the polishing table, while supplying the cerium oxide slurry of any one of (1) to (4) or the cerium oxide polishing slurry of any one of (5) to (7) between the film to be polished and the polishing cloth.

The cerium oxide slurry, cerium oxide polishing solution (or called polishing slurry), and polishing method of substrate using the same of the invention are capable of decreasing scratches and increasing the polishing speed, by defining the ratio of cerium oxide concentration/dispersant concentration so that the content of coarse grains may be smaller. Further, by minimizing causes of scratches due to aggregate particles, both high yield and high throughput can be realized.

The disclosure of the present patent application is related to the subject mentioned in Japanese Patent Application Laid-Open No. 2005-304311 filed on Oct. 19, 2005, and contents of these applications are incorporate herein by reference.

DETAILED DESCRIPTION OF THE PREFERRED EMBODIMENTS

Figure 1:
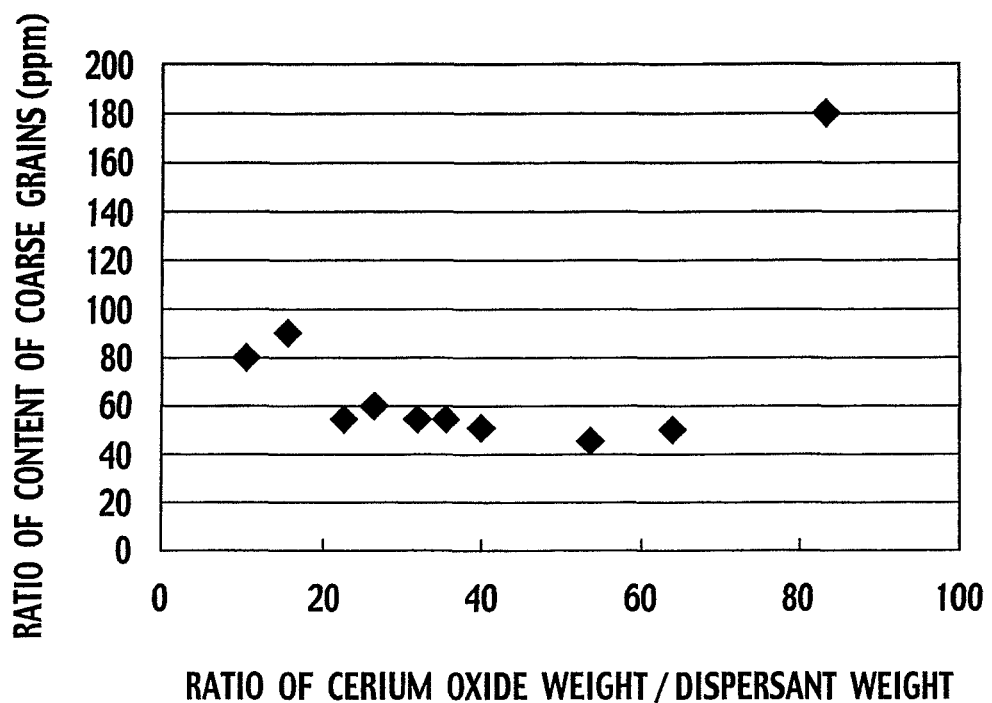
FIG. 1 is a graph showing the relation of ratio of content of coarse grains and the ratio of cerium oxide weight/dispersant weight.

The cerium oxide polishing slurry of the invention is prepared, for example, by fabricating the cerium oxide slurry of the invention comprising cerium oxide particles, dispersant and water, and an additive solution containing additives and water and mixing them.

First, the cerium oxide slurry of the invention is described. The cerium oxide particles of the invention are obtained by oxidizing cerium compound such as carbonate, nitrate, sulfate or oxalate. When the cerium oxide polishing slurry is used in polishing of a silicon oxide film formed by TEOS-CVD method or the like, high speed polishing is possible when the crystal size of particles is larger, and crystal distortion is smaller, that is, the crystallinity is higher. However, the film tends to be scratched by polishing.

Cerium oxide particles of the invention are preferred to be 1 to 400 nm in crystal size although the manufacturing method is limited.

When used in polishing in manufacturing process of semiconductor devices, for example, the content of impurities such as alkali metal or halogens in cerium oxide particles is preferred to be suppressed at 10 ppm or less.

In the invention, the method of manufacturing cerium oxide particles includes a method of calcination or oxidation by hydrogen peroxide. The calcining temperature is preferably 350 to 900° C.

When cerium oxide particles thus manufactured are aggregated, it is preferred to crush mechanically. Crushing method includes dry crushing by jet mill, or wet crushing by planet beads mill.

A method of dispersing such cerium oxide particles in water that is a main disperse medium includes, for example, a method of using homogenizer, ultrasonic dispersing machine, or wet process ball mill, aside from a method of dispersion process by using an ordinary agitator.

A method of further microparticulating the cerium oxide dispersed by the above method includes, for example, a sedimentation and sorting method of settling cerium oxide disperse solution by force by small centrifugal separator, and taking out only the supernatant. Besides, a high pressure homogenizer may be used for collision of the cerium oxide particles in the disperse medium mutually at high pressure.

Mean size of particle of cerium oxide particles in the cerium oxide slurry manufactured in this procedure is preferred to be 1 to 400 nm, more preferably 1 to 300 nm, or most preferably 1 to 200 nm. If the mean size of particle is less than 1 nm, the polishing speed tends to decline, and if exceeding 400 nm, the film is likely to be scratched in polishing.

Mean size of particle of cerium oxide particles in the invention is the median value or cumulative center value of volume distribution measured by laser diffraction type particle size distribution meter.

Concentration of cerium oxide particles is preferred to be 0.1 to 10 parts by weight in 100 parts by weight of cerium oxide slurry, preferably 0.2 to 2 parts by weight, or more preferably 0.5 to 1.5 parts by weight. If the concentration is less than 0.1 part by weight, the polishing speed tends to decline, and if exceeding 10 parts by weight, cerium oxide particles tend to be aggregated.

The dispersant of the invention is not particularly limited as far as it is a compound soluble in water, and generally the solubility of compound in water is preferred to be 0.1 wt. % to 99.9 wt. %. Preferred examples are water-soluble anionic dispersant, water-soluble nonionic dispersant, water-soluble cationic dispersant, and water-soluble amphoteric dispersant. Other preferable examples are polymer dispersant of polycarboxylic acid type mentioned below such as poly (meth)acrylate. A polymer dispersant having ammonium acrylate salt as constituent unit as copolymer component is more preferred. Examples of polymer dispersant having ammonium acrylate salt as constituent unit as copolymer component include ammonium polyacrylate salt, and copolymer ammonium salt of alkyl polyacrylate and acrylate.

The dispersant may be composed of two or more type including at least one type of polymer dispersant having ammonium acrylate salt as constituent unit as copolymer component, and at least one type selected from other dispersants. When used in polishing in manufacturing process of semiconductor devices, the content of impurities in total dispersant, for example, alkali metal such as sodium ion and potassium ion, halogen atom or sulfur atom is preferred to be suppressed to 10 ppm or less by mass in the polishing slurry.

Examples of water-soluble anionic dispersant include triethanolamine lauryl sulfate, ammonium lauryl sulfate, triethanolamine polyoxy ethylene alkyl ether sulfate, and polymer dispersant of polycarboxylate type.

Examples of polymer dispersant of polycarboxylate type include polymer of carboxylic monomer having unsaturated double bond such as acrylic acid, methacrylic acid, maleic acid, fumaric acid, itaconic acid, copolymer of carboxylic monomer having unsaturated double bond and other monomer having unsaturated double bond, and ammonium salt or amine salt of them.

Examples of water-soluble nonionic dispersant include polyoxy ethylene lauryl ether, polyoxy ethylene cetyl ether, polyoxy ethylene stearyl ether, polyoxy ethylene oleyl ether, polyoxy ethylene higher alcohol ether, polyoxy ethylene octyl phenyl ether, polyoxyethylene nonyl phenyl ether, polyoxyalkylene alkylether, polyoxyethylene derivative, polyoxyethylenesorbitan monolaurate, polyoxy ethylene sorbitan monopalmitate, polyoxy ethylene sorbitan monostearate, polyoxy ethylene sorbitan tristearate, polyoxy ethyelene sorbitan mono-oleate, polyoxy ethylene sorbitan trioleate, tetraoleic polyoxy ethylene sorbit, polyethylene glycol monolaurate, polyethylene glycol monostearate, polyethylene glycol distearate, polyethylene glycol mono-oleate, polyoxy ethylene alkylamine, polyoxy ethylene cured castor oil, 2-hydroxyethyl methacrylate, and alkyl alkanolamide.

Examples of water-soluble cationic dispersant include polyvinyl pyrrolidone, coconut amine acetate, and stearyl amine acetate.

Examples of water-soluble biphoteric dispersant include lauryl betaine, stearyl betaine, lauryl dimethylamine oxide, and 2-alkyl-N-carboxymethyl-N-hydroxy ethyl imidazolinium betaine.

These dispersants may be used alone or in combination of two or more type.

The dispersant is preferably used for dispersing the cerium oxide particles stably in water or other disperse medium.

At this time, the ratio of cerium oxide weight/dispersant weight is required to be 20 to 80. If the ratio is lower than 20, the dispersant concentration is so excessive that dispersant molecules work as bridging agents, leading to cause aggregation between particles, and scratches are increased by the aggregation.

On the other hand, if the ratio is higher than 80, the dispersant concentration is so insufficient that dispersant molecules are in shortage, and particles are aggregated to each other directly without help of dispersant, and scratches are also increased by aggregation.

Preferably, the ratio of cerium oxide weight/dispersant weight is 25 to 70, more preferably 30 to 50.

By defining in a range of 30 to 50, the scope of satisfying the three properties mentioned below is established: the content ratio of coarse grains is lowered, scratches are decreased, and the polishing speed is increased.

In the embodiment, "the dispersant weight" is not the blending weight, but the weight calculated from the net concentration of dispersant in the cerium oxide slurry. When the cerium oxide slurry is prepared by a sedimentation and sorting method of settling the slurry by force by small centrifugal separator, and taking out only the supernatant, the net concentration of dispersant in the slurry is different from the blending concentration. Hence, the actual concentration of dispersant is measured in the slurry obtained by the sedimentation and sorting method.

Measuring method of dispersant weight is realized by using total organic carbon meter (for example, TOC-V, manufactured by Shimadzu Corporation), or conductivity meter (for example, ES-51, manufactured by HORIBA, Ltd.). A working curve solution is prepared by using dispersant aqueous solutions adjusted to specified concentration by using the same dispersant, and the characteristics of the solutions are measured. Later, after removal of cerium oxide particles, the cerium oxide slurry is measured, and the weight is determined by comparing with the working curve.

The content ratio of coarse grains is determined in the method specified below. Fifty grams of 5 weight % cerium oxide slurry is diluted in water to obtain 500 g, and the slurry is passed through a membrane filter of pore size of 2 μm (TTTP04700, manufactured by MILLIPORE).

The filter weight before and after passing is measured in the unit of 0.01 mg, and the weight of coarse grains depositing on the filter is determined.

The coarse grain weight/(5 wt. %×50 g) is calculated, and the content of coarse grains left over on the filter is determined. This value is preferred to be 300 ppm or less, more preferably 100 ppm or less, or most preferably 60 ppm or less.

The cerium oxide polishing slurry of the invention contains cerium oxide slurry of the invention, and water-soluble polymer. The cerium oxide polishing slurry may be stored either as two-pack type separating into cerium oxide slurry and additive solution containing water-soluble polymer, or as one-pack type preliminarily mixing cerium oxide slurry and additive solution.

When stored as two-pack type consisting of cerium oxide slurry and additive solution, by freely changing the blending ratio of two liquids, it is possible to adjust the global flattening characteristics and polishing speed.

When polishing by using two-pack type polishing slurry, various methods may be realized, for example, the cerium oxide slurry and additive solution are sent by different pipes, these pipes are joined and connected at the outlet of supply piping to supply the mixture on the polishing table, or the cerium oxide slurry and additive solution are mixed just before polishing, or may be supplied simultaneously on the polishing table. Further, when mixing, as required, deionized water is may be mixed to adjust the polishing characteristics.

In the invention, the additive solution contains additives such as water-soluble polymer, and water. Additives include, as required, pH regulating agent such as ammonia and acid, and others.

Water-soluble polymer used as additive is not particularly limited, and examples include polysaccharides and its salt such as arginic acid, pectic acid, carboxy methyl cellulose, agar-agar, cardlan, purlan; polycarboxylic acid such as polyacrylic acid, polymethacrylic acid, polystyrene carbon, polysulfonic acid, polyaspartic acid, polyglutamic acid, polylycine, polymalic acid, polyamide acid, polymaleic acid, polyitaconic acid, polyfumaric acid, polyamide acid ammonium salt, polyamide acid sodium salt, polyglyoxylic acid; vinyl polymers such as polyvinyl alcohol, polyvinyl pyrrolidone, polyacrolein. They may be also copolymers.

The polishing slurry of the invention contains water-soluble polymer, and hence the flattening characteristics can be enhanced. The water-soluble polymer has an effect of suppressing the polishing speed of silicon nitride film as stopper film, rather than the polishing speed of silicon oxide film as the main film to be polished, and therefore the process management is easier. Depending on the case, it may also have a function as dispersant. The weight-average molecular weight of water-soluble polymer is preferred to be 500 or more. The blending amount is preferred to be 0.01 part by weight or more to 5 parts by weigh or less in 100 parts by weight of polishing slurry. More preferably, the weight-average molecular weight is 1,000 or more to 20,000 or less, or particularly preferably 2,000 or more to 10,000 or less. If the molecular weight is too low, the flattening effect may not be sufficient, or if the molecular weight is too high, cerium oxide particles tend to be aggregated, or the polishing speed may be lowered in the pattern convex portions.

The content of water-soluble polymer is preferred to be in a range of 0.01 part by weight to 2 parts by weight in 100 parts by weight of polishing slurry, more preferably 0.1 part by weight to 1 part by weight. If the content is too low, high flattening effect may be hard to be obtained, or if too much, the polishing speed tend to be lowered substantially in the pattern convex portions, or the dispersion stability of cerium oxide particles tends to decline.

The polishing method of the invention is characterized by polishing a film to be polished by relatively moving a polishing table and a substrate having the film to be polished in the state that the substrate is pressed against a polishing cloth of the polishing table, while supplying the cerium oxide slurry of the invention or the cerium oxide polishing slurry of the invention between the film to be polished and the polishing cloth.

The substrate is a substrate used in manufacturing process of semiconductor devices, for example, a semiconductor substrate forming circuit devices and wiring pattern, and a substrate forming inorganic dielectrics on the semiconductor substrate.

The film to be polished is, for example, inorganic dielectrics such as silicon oxide layer, silicon nitride layer.

By polishing such silicon oxide layer or silicon nitride layer formed on the semiconductor substrate by the cerium oxide slurry or the polishing slurry, asperities on the substrate surface are eliminated, and a smooth surface is obtained on the entire substrate.

The polishing method of the invention is also applicable in shallow trench isolation. For use in shallow trench isolation, the ratio of silicon oxide film polishing speed and silicon nitride film polishing speed, that is, silicon oxide film polishing speed/silicon nitride film polishing speed is preferably 10 or more. When this ratio is 10 or more, decrease of polishing speed after exposure of silicon nitride film is greater, and it is easy to stop polishing. On the other hand, if it is less than 10, it tends to be hard to stop polishing at specified position.

Further, for use in shallow trench isolation, it is preferred that occurrence of scratches should be small in polishing process.

Referring to an example of semiconductor substrate formed inorganic dielectrics layer such as silicon oxide film, the polishing method is specifically described below.

In the polishing method of the invention, an example of the polishing apparatus is a general polishing apparatus comprising a holder for holding the substrate having film to be polished such as semiconductor substrate, and a polishing table to which a polishing cloth (pad) can be attached and equipped with a motor adjustable in rotating speed.

Such polishing apparatus includes, for example, polishing apparatus model EPO-111, manufactured by Ebara Corporation. The polishing cloth is not particularly limited, and general nonwoven cloth, foamed polyurethane, and porous fluoro plastics may be used.

The polishing cloth is preferably provided with grooves for holding the cerium oxide slurry or polishing slurry.

The polishing condition is not particularly limited, but from the viewpoint of preventing the semiconductor substrate from popping out, the rotating speed of polishing table is preferred to be 200 min$^{-1}$ or less, and the pressure (processing load) applied on the semiconductor substrate is preferred to be 100 kPa or less from the viewpoint of preventing scratches by polishing. In the process of polishing, it is preferred to supply cerium oxide slurry or polishing slurry on the polishing cloth continuously by pump or the like. The supply flow rate is not particularly limited, but it is preferred that the surface of polishing cloth is always covered with cerium oxide slurry or polishing slurry.

After polishing, preferably, the semiconductor substrate is cleaned in running water, and dried after wiping off water drops the semiconductor substrate by using spin drier or the like. In this manner, the inorganic dielectric layer that is a film to be polished is polished by cerium oxide slurry or polishing slurry, and surface asperities are eliminated, and a smooth surface is obtained on the entire semiconductor substrate.

After thus forming flattened shallow trenches, an aluminum wiring is formed on the inorganic dielectric film, and the inorganic dielectric film is formed between wiring and on the wiring by the method described below, and the surface is polished to be smooth similarly by using the cerium oxide slurry or polishing slurry. By repeating this process by a predetermined number of times, a semiconductor substrate having a desired number of layers is manufactured.

A method of fabricating inorganic dielectrics such as silicon oxide film to be polished by using the cerium oxide slurry or polishing slurry of the invention includes, for example, a low pressure CVD method or a plasma CVD method.

The low-pressure CVD method for producing a silicon oxide film uses monosilane ($SiH_4$) as the Si source and oxygen ($O_2$) as the oxygen source. The silicon oxide film is produced by the $SiH_4$—$O_2$ oxidation effected at a low temperature of 400° C. or lower. As required, the silicon oxide film is heated at 1000° C. or less after CVD.

When it is doped with phosphorus (P) for surface-flattening by reflow at high temperature, a preferable reaction gas is a mixture of $SiH_4$—$O_2$—$PH_3$.

It is an advantage of the plasma CVD method that chemical reaction occurs at low temperature, whereas high temperature is required in ordinary thermal equilibrium. A plasma generating method includes capacitive coupling type and inductive coupling type. Reaction gas includes $SiH_4$—$N_2O$ system gas using $SiH_4$ as silicon source and $N_2O$ as oxygen source, and TEOS-$O_2$ system gas (TEOS-plasma CVD method) using tetraethoxy silane (TEOS) as silicon source. The substrate temperature is preferred to be 250° C. to 400° C., and the reaction pressure is preferred to be in a range of 67 to 400 Pa.

Thus, the silicon oxide film in the invention may be doped with an element such as phosphorus or boron. Similarly, the silicon nitride film by low pressure CVD is formed by using dichlorosilane ($SiH_2Cl_2$) as silicon source, and ammonia ($NH_3$) as nitrogen source. The silicon nitride film is obtained by performing $SiH_2Cl_2$—$NH_3$ system oxidation reaction at high temperature of 900° C.

In formation of silicon nitride film by the plasma CVD method, the reaction gas is, for example, $SiH_4$—$NH_3$ system gas using $SiH_4$ as silicon source, and $NH_3$ as nitrogen source. The substrate temperature is preferred to be 300° C. to 400° C.

The cerium oxide slurry, polishing slurry, and polishing method of the invention may be applied not only in the silicon oxide film formed on the semiconductor substrate, but also in the manufacturing process of various semiconductor devices. For example, the invention is applied in polishing of inorganic dielectrics film such as silicon oxide film, glass, silicon nitride, formed in wiring board having specified wiring; films mainly containing polysilicon, Al, Cu, Ti, TiN, W, Ta, TaN and the like; optical glass such as photo mask, lens, prism; inorganic conductive films such as ITO; optical single crystals such as optical integrated circuit composed of glass and crystal material, optical switching device, optical waveguide, end of optical fiber, scintillator; semiconductor single crystals such as solid-state laser single crystal, sapphire substrate for blue laser LED, SiC, GaP, GaAs; glass substrate for magnetic disk; and magnetic head.

EXAMPLES

Examples 1 to 7

(Preparation of Cerium Oxide Ground Powder)

Forty kilo-grams of cerium carbonate hydrate was put in an aluminum container, and calcined in air for 2 hours at 830° C., and 20 kg of yellowish white powder was obtained. This powder was determined in phase by X-ray diffraction method, and was identified to be cerium oxide. The calcined powder particle size was 20 to 100 μm.

Twenty kilograms of the cerium oxide particle powder was ground in dry process by using a jet mill. The specific surface area of polycrystal was measured by BET method, and 9.4 m$^2$/g was obtained.

(Preparation of Cerium Oxide Slurry)

The ground cerium oxide powder, 10.0 kg, was mixed with 116.65 kg of deionized water, and 228 g of commercial aqueous solution of ammonium salt polyacrylate (weight-average molecular weight 8000, 40% by weight) was added as dispersant, and the mixture was stirred for 10 minutes. By ultrasonic irradiation in piping for sending into other container, cerium oxide was dispersed. Ultrasonic frequency was 400 Hz, and the solution was transmitted in 30 minutes.

In four beakers of 500 mL, cerium oxide disperse solution was dispensed by 500 g+/−20 g each, and centrifugally separated. The centrifugal separation condition was 2 minutes with the centrifugal force applied on the outer circumference set at 500 G. Cerium oxide settling in the bottom of the beaker was removed. Solid matter concentration of the sampled cerium oxide disperse solution was measured, and the solution was 7.0%.

The sample was diluted in deionized water until the solid matter concentration was lowered to 5.0 wt. %, and cerium oxide slurry was obtained. Using laser diffraction type particle size distribution counter (trade name: LA-920, manufactured by HORIBA, Ltd.), the mean size of particle (cumulative median value) was measured in the condition of refractive index of 1.93 and transmissivity of 68%, and 170 nm was obtained.

Using atomic absorption photometer (model name: AA-6650, manufactured by Shimadzu Corporation), impurity ions (Na, K, Fe, Al, Zr, Cu, Si, Ti) in the cerium oxide slurry were measured, and the content was 1 ppm by mass or less.

(Preparation of Dispersant Solution for Working Curve, and Plotting of Working Curve)

Four solutions of ammonium salt polyacrylate were prepared at concentrations of 0.05 wt. %, 0.1 wt. %, 0.2 wt. %, and 0.4 wt. %, and the concentration of carbon dioxide was measured by using total organic carbon meter (TOC-V, manufactured by Shimadzu Corporation).

Correlation of concentration of ammonium salt polyacrylate and concentration of carbon dioxide was plotted by proportional relation passing the origin. As a result, the correlation coefficient was 0.98.

(Measurement of Dispersant Concentration in Cerium Oxide Slurry)

Forty grams of cerium oxide slurry of solid matter concentration of 5 wt. % prepared above was put in a 50 cc settling tube of centrifugal separator, and was centrifugally separated for 30 minutes at 8000 $min^{-1}$ by using small centrifugal separator (CF15RX, manufactured by Hitachi Koki Co., Ltd.), and the solution was completely separated into solid and liquid. After solid-liquid separation, the solution of supernatant component was obtained, and the concentration of ammonium salt polyacrylate in the solution was determined by total organic carbon meter. From the prepared working curve, the concentration of ammonium salt polyacrylate was determined, and 0.052 wt. % was obtained. Hence, the ratio of cerium oxide weight/dispersant weight was 96.

(Additional Supply of Dispersant)

In order that the ratio of cerium oxide weight/dispersant weight may settle in a range of 20 to 80, aqueous solution of ammonium salt polyacrylate adjusted to 5 wt. % was additionally supplied in 1000 g of 5 wt % cerium oxide slurry, and the cerium oxide slurry compositions in examples 1 to 7 shown in Table 1 were obtained. The additional supply amount is also shown in Table 1.

(Re-Measurement of Dispersant Concentration in Cerium Oxide Slurry)

In the cerium oxide slurry of examples 1 to 7 obtained by additional supply of dispersant, after centrifugal separation for 30 minutes at 8000 $min^{-1}$, the concentration of ammonium salt polyacrylate was measured by the total organic carbon meter in the same manner as in measurement of concentration mentioned above. The actual concentration of dispersant and the ratio by weight obtained in examples 1 to 7 is shown in Table 1.

(Measurement of Content Ratio of Coarse Grains)

Forty grams of cerium oxide slurry in examples 1 to 7 obtained by additional supply of dispersant was diluted in water to 500 g, and the slurry was passed through in membrane filter having pore of 2 μm (TTTP04700, manufactured by MILLIPORE). The filter weight before and after passing is measured in the unit of 0.01 mg, and the weight of coarse grains depositing on the filter was determined.

The coarse grain weight/(5 wt. %×50 g) was calculated, and the content ratio of coarse grains left over on the filter was determined. Results of content ratio of coarse grains are also shown in Table 1.

(Evaluation of Mean Size of Particle)

In the cerium oxide slurry in examples 1 to 7 obtained by additional supply of dispersant, the mean size of particle (mean size) was measured in the condition of refractive index of 1.93 and transmissivity of 68% by using laser diffraction type particle size distribution counter (trade name: LA-920, manufactured by HORIBA, Ltd.). Results are shown in Table 1. In all samples, the mean size was in a range of 160+/−5 nm, and there was no sign of aggregation.

(Evaluation of Polishing Speed)

As test wafer for evaluation of dielectric CMP, P-TEOS film formed in a thickness of 1 μm was used. Using polishing apparatus (trade name: Mirra 3400, manufactured by Applied Material Inc.), the test wafer was set on the holder adhered the adsorption pad for setting the substrate. On the polishing table of 500 mm in diameter, polishing pad of porous urethane resin (k-grooves, model IC-1400, manufactured by Rodel) was adhered.

The holder having the dielectric side underneath was placed on the polishing pad, and the inner tube pressure, retainer ring pressure, and membrane pressure were respectively set at 23 kPa, 31 kPa, and 23 kPa. The P-TEOS film was polished for 1 minute by operating the polishing table and wafer at rotating speed of 93 revolutions/min and 87 revolutions/min respectively, with the cerium oxide slurry in examples 1 to 7 applied on the polishing table at a rate of 120 mL/min, while the 3% aqueous solution of ammonium salt polyacrylate (pH=6.8) was dropped as additive solution simultaneously at a rate of 80 mL/min.

The wafer after polishing was cleaned in purified water and dried. Using light interference type film thickness measuring instrument (trade name: RE-3000, manufactured by DAIN-IPPPON SCREEN MFG CO. LTD.), the residual thickness of $SiO_2$ film was measured at 30 points on the wafer surface, and the polishing speed was calculated from the decrement of film thickness before polishing. Calculated results are shown in Table 1.

(Evaluation of Polishing Scratches)

The wafer after polishing was immersed in 0.5% hydrofluoric acid aqueous solution for 0.5 minute to remove cerium oxide particles, and cleaned sufficiently in purified water. After subsequent brush cleaning, the surface of P-TEOS after the cleaning was inspected by defect inspection instrument (Surf scan 6220, manufactured by Tencor), and the number of defects was counted. The vicinity of coordinates of defects was observed by optical microscope, and defects of scratches were 10 positions/wafer or less in every example as shown in Table 1.

Comparative Examples 1 to 3

(Preparation of Cerium Oxide Slurry, Additional Supply of Dispersant, and Re-Measurement of Concentration of Dispersant)

The operation was same as in the foregoing examples until preparation of slurry prepared at 5 wt. % after centrifugal separation. Later, in Comparative Example 1, the dispersant was not supplied additionally. In Comparative Examples 2 and 3, the amount of additional supply of dispersant conformed to Table 2.

Same as in the method of examples 1 to 7, the actual concentration of ammonium salt of polyacrylate was measured, and the ratio of cerium oxide weight/dispersant weight was determined, and the results are shown in Table 2 together. The ratio was 16.1 in example 2, and 10.7 in example 3.

(Measurement of Content Ratio of Coarse Grains)

According to the method of examples 1 to 7, the content ratio of coarse grains was measured, and as shown in Table 2, Comparative Example 1 presented the content ratio of coarse particles of 180 ppm, showing more than 3 times of the content ratio of coarse particles in examples 1 to 7. In Comparative Examples 2 and 3, the results were 90 ppm and 80 ppm, being a little larger as compared with examples 1 to 7.

(Evaluation of the Mean Size)

Cerium oxide slurry in Comparative Examples 1 to 3 was measured same as in examples 1 to 7. Results are shown in Table 2. In Comparative Example 1, the mean size was 163 nm, and no abnormality was noted. In Comparative Examples 2 and 3, results were 180 nm and 220 nm, and aggregation due to excessive dispersant was observed.

(Evaluation of Polishing Speed)

The samples were polished in the polishing method of examples 1 to 7, and the polishing speed was about 20% lower in Comparative Example 1 as compared with the examples as shown in Table 2.

(Evaluation of Scratches)

The samples were polished in the polishing method of examples 1 to 7, and scratches by polishing were observed after cleaning. As shown in Table 2, many defects of polishing scratches such as Comparative Examples 1, 2, 3 disclosing 34, 18 and 22 scratches were observed as compared with examples.

Figure 2:
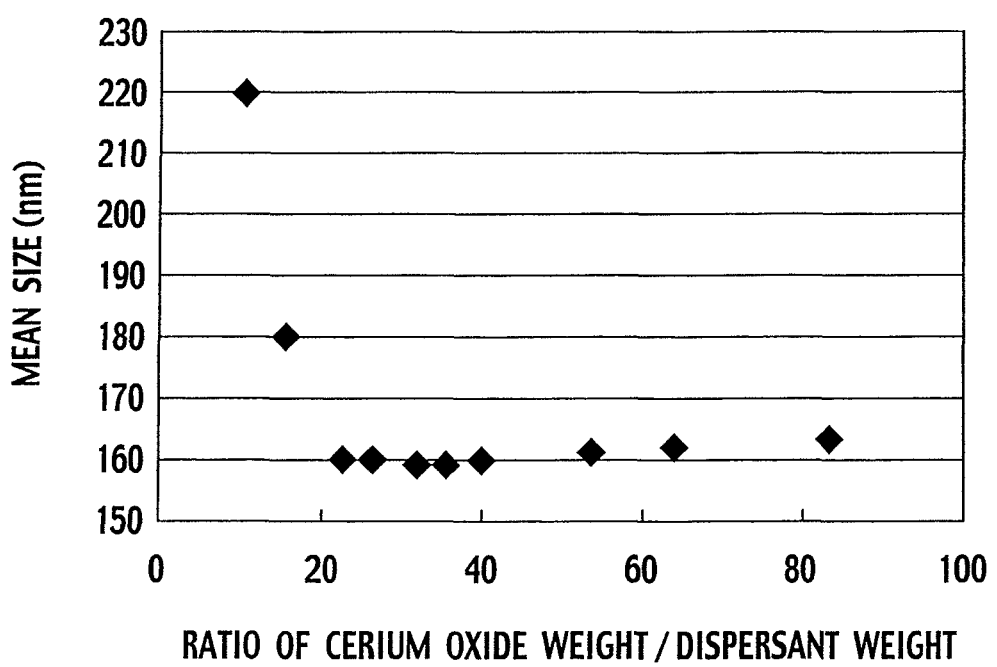
FIG. 2 is a graph showing the relation of mean size of particle and the ratio of cerium oxide weight/dispersant weight.
Figure 3:
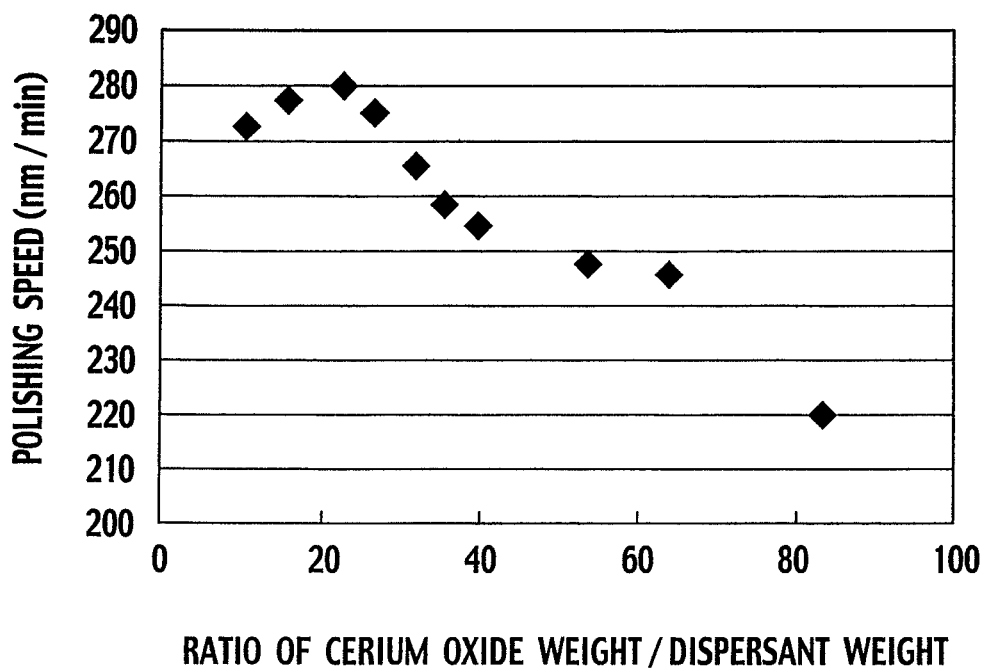
FIG. 3 is a graph showing the relation of polishing speed and the ratio of cerium oxide weight/dispersant weight.
Figure 4:
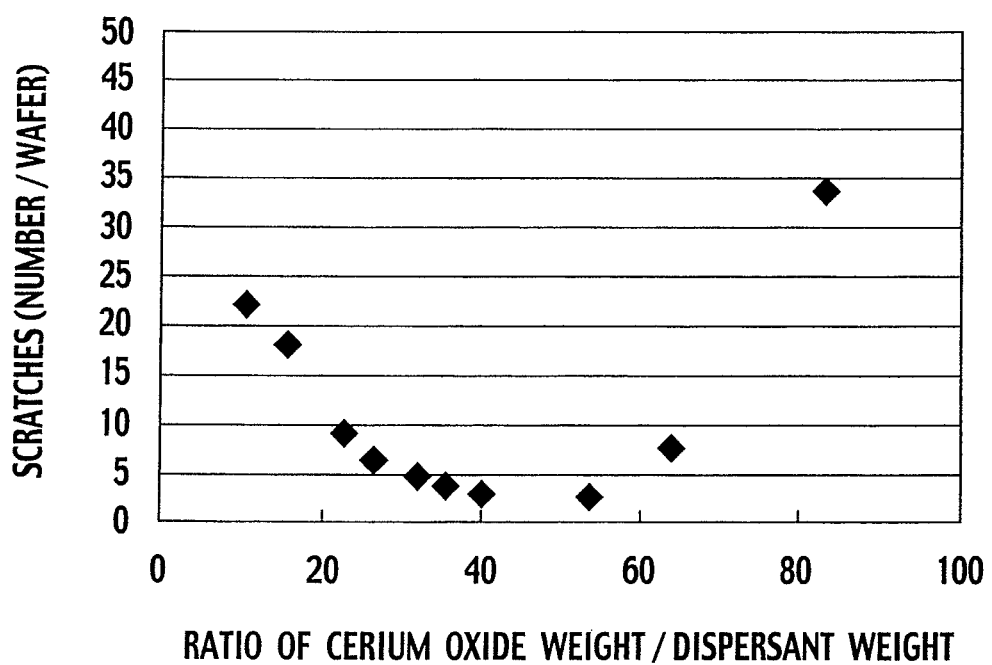
FIG. 4 is a graph showing the relation of scratches and the ratio of cerium oxide weight/dispersant weight.

The illustrated relation of content ratio of coarse particles, mean size, polishing speed, scratches, and ratio of cerium oxide weight/dispersant weight in Table 1 and Table 2 is shown in FIG. 1, FIG. 2, FIG. 3, and FIG. 4 respectively.

The invention claimed is:

1. A method of producing a cerium oxide slurry comprising
   oxidizing a cerium compound to obtain a cerium oxide,
   crushing the cerium oxide to obtain a cerium oxide particles,
   mixing the cerium oxide particles, a dispersant and water, and dispersing the cerium oxide particles in the water to obtain a cerium oxide disperse solution,
   microparticulating the cerium oxide particles by sedimentation and sorting the cerium oxide disperse solution to take out only the supernatant from the cerium oxide disperse solution,
   adjusting the microparticulated cerium oxide disperse solution to prepare the cerium oxide slurry,
   measuring a ratio of weight of cerium oxide/weight of dispersant in the cerium oxide slurry, and
   adjusting the concentration of the dispersant in the cerium oxide slurry in order to obtain a ratio that settles in a range of 20 to 40,
   wherein mean size of particle of the cerium oxide particles in the cerium oxide slurry is 1 to 200 nm,
   wherein the weight of cerium oxide is the weight of the cerium oxide in the cerium oxide slurry, and
   wherein the weight of dispersant is the weight of the dispersant in the cerium oxide slurry obtained by measuring a concentration of the dispersant in the cerium oxide slurry after the cerium oxide particles are removed.

TABLE 1

| | Example | | | | | | |
|---|---|---|---|---|---|---|---|
| | 1 | 2 | 3 | 4 | 5 | 6 | 7 |
| 5 wt. % slurry blending amount (g) | 1000 | | | | | | |
| 5 wt. % polyacrylate aqueous solution additional supply (g) | 2.05 | 4.12 | 8.24 | 10.30 | 12.36 | 16.47 | 20.59 |
| Dispersant actual concentration (wt. %) | 0.078 | 0.093 | 0.125 | 0.14 | 0.156 | 0.187 | 0.218 |
| Ratio of cerium oxide wt./dispersant wt. | 64.1 | 53.8 | 40.0 | 35.7 | 32.1 | 26.7 | 22.9 |
| Content ratio of coarse grains (ppm) | 50 | 45 | 51 | 55 | 55 | 60 | 55 |
| Mean size (nm) | 162 | 161 | 100 | 159 | 159 | 160 | 160 |
| P-TEOS polishing speed (nm/min) | 246 | 248 | 255 | 259 | 266 | 276 | 280 |
| No. of scratches (positions/wafer) | 8 | 3 | 3 | 4 | 5 | 7 | 9 |

TABLE 2

| | Comparative Example | | |
|---|---|---|---|
| | 1 | 2 | 3 |
| 5 wt. % slurry blending amount (g) | 1000 | | |
| 5 wt. % polyacrylate aqueous solution additional supply (g) | 0 | 32.94 | 53.53 |
| Dispersant actual concentration (wt. %) | 0.060 | 0.311 | 0.467 |
| Ratio of cerium oxide wt./dispersant wt. | 83.3 | 16.1 | 10.7 |
| Content ratio of coarse grains (ppm) | 180 | 90 | 80 |
| Mean size (nm) | 163 | 180 | 220 |
| P-TEOS polishing speed (nm/min) | 220 | 278 | 273 |
| No. of scratches (positions/wafer) | 34 | 18 | 22 |

2. The method of producing a cerium oxide slurry according to claim 1, wherein the cerium compound is selected from the group consisting of carbonate, nitrate, sulfate or oxalate of cerium.

3. The method of producing a cerium oxide slurry according to claim 1, wherein the dispersant is a compound possessing a solubility in water of 0.1 wt. % to 99.9 wt. %.

4. The method of producing a cerium oxide slurry according to claim 1, wherein the dispersant is a salt of poly (meth) acrylic acid.

5. The method of producing a cerium oxide slurry according to claim 1, wherein the dispersant is ammonium salt polyacrylate or ammonium salt of copolymer of acrylic acid and methacrylic acid.

6. A method of producing a cerium oxide polishing slurry comprising
mixing the cerium oxide slurry produced by the method according to claim 1, and an additive solution comprising a water-soluble polymer and a water.

7. The method of producing a cerium oxide polishing slurry according to claim 6, wherein the cerium oxide polishing slurry is a one-pack storage type.

8. The method of producing a cerium oxide polishing slurry according to claim 6, wherein the cerium oxide polishing slurry is a two-pack storage type,
wherein one pack contains the cerium oxide slurry and another pack contains the additive solution.

9. A method of producing a cerium oxide slurry comprising
oxidizing a cerium compound to obtain a cerium oxide,
crushing the cerium oxide to obtain a cerium oxide particles,
mixing the cerium oxide particles, a dispersant and water, and dispersing the cerium oxide particles in the water to obtain a cerium oxide disperse solution,
microparticulating the cerium oxide particles by collision of the cerium oxide particles in the cerium oxide disperse solution mutually at high pressure,
adjusting the microparticulated cerium oxide disperse solution to prepare the cerium oxide slurry,
measuring a ratio of weight of cerium oxide/weight of dispersant in the cerium oxide slurry, and
adjusting the concentration of the dispersant in the cerium oxide slurry in order to obtain a ratio that settles in a range of 20 to 40,
wherein mean size of particle of the cerium oxide particles in the cerium oxide slurry is 1 to 200 nm,
wherein the weight of cerium oxide is the weight of the cerium oxide in the cerium oxide slurry, and
wherein the weight of dispersant is the weight of the dispersant in the cerium oxide slurry obtained by measuring a concentration of the dispersant in the cerium oxide slurry after the cerium oxide particles are removed.

10. The method of producing a cerium oxide slurry according to claim 9, wherein the cerium compound is selected from the group consisting of carbonate, nitrate, sulfate or oxalate of cerium.

11. The method of producing a cerium oxide slurry according to claim 9, wherein the dispersant is a compound possessing a solubility in water of 0.1 wt. % to 99.9 wt. %.

12. The method of producing a cerium oxide slurry according to claim 9, wherein the dispersant is a salt of poly (meth) acrylic acid.

13. The method of producing a cerium oxide slurry according to claim 9, wherein the dispersant is ammonium salt polyacrylate or ammonium salt of copolymer of acrylic acid and methacrylic acid.

14. A method of producing a cerium oxide polishing slurry comprising
mixing the cerium oxide slurry produced by the method according to claim 9, and an additive solution comprising a water-soluble polymer and a water.

15. The method of producing a cerium oxide polishing slurry according to claim 14, wherein the cerium oxide polishing slurry is a one-pack storage type.

16. The method of producing a cerium oxide polishing slurry according to claim 14, wherein the cerium oxide polishing slurry is a two-pack storage type,
wherein one pack contains the cerium oxide slurry and another pack contains the additive solution.

* * * * *